(12) United States Patent
Nikonov et al.

(10) Patent No.: US 10,361,292 B2
(45) Date of Patent: Jul. 23, 2019

(54) MAGNETO-ELECTRIC LOGIC DEVICES USING SEMICONDUCTOR CHANNEL WITH LARGE SPIN-ORBIT COUPLING

(71) Applicant: Board of Regents of the University of Nebraska, Lincoln, NE (US)

(72) Inventors: Dmitri E. Nikonov, Beaverton, OR (US); Christian Binek, Lincoln, NE (US); Xia Hong, Lincoln, NE (US); Jonathan P. Bird, Buffalo, NY (US); Kang L. Wang, Los Angeles, CA (US); Peter A. Dowben, Crete, NE (US)

(73) Assignees: INTEL CORPORATION, Santa Clara, CA (US); THE RESEARCH FOUNDATION FOR THE STATE UNIVERSITY OF NEW YORK, Amherst, NY (US); BOARD OF REGENTS OF THE UNIVERSITY OF NEBRASKA, Lincoln, NE (US); THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/898,457

(22) Filed: Feb. 17, 2018

(65) Prior Publication Data

US 2018/0240896 A1    Aug. 23, 2018

Related U.S. Application Data

(60) Provisional application No. 62/460,164, filed on Feb. 17, 2017.

(51) Int. Cl.
*G11C 11/00*     (2006.01)
*H01L 29/66*     (2006.01)
(Continued)

(52) U.S. Cl.
CPC ........ *H01L 29/66984* (2013.01); *B82Y 10/00* (2013.01); *G11C 11/14* (2013.01);
(Continued)

(58) Field of Classification Search
CPC ... H01L 29/66984; H01L 29/08; H01L 29/24; H01L 29/423; G11C 11/14;
(Continued)

(56) References Cited

U.S. PATENT DOCUMENTS 9,620,654 B2 * 4/2017 Kelber ................ H01L 29/4908
2011/0233524 A1 * 9/2011 Wang .................... B82Y 10/00
257/39
(Continued)

*Primary Examiner* — Toan K Le
(74) *Attorney, Agent, or Firm* — Talem IP Law, LLP

(57) ABSTRACT

Antiferromagnetic magneto-electric spin-orbit read (AF-SOR) logic devices are presented. The devices include a voltage-controlled magnetoelectric (ME) layer that switches polarization in response to an electric field from the applied voltage and a narrow channel conductor of a spin-orbit coupling (SOC) material on the ME layer. One or more sources and one or more drains, each optionally formed of ferromagnetic material, are provided on the SOC material.

20 Claims, 9 Drawing Sheets

(51) Int. Cl.
    *H01L 29/24*     (2006.01)
    *G11C 11/16*     (2006.01)
    *G11C 11/18*     (2006.01)
    *G11C 11/14*     (2006.01)
    *G11C 11/22*     (2006.01)
    *H01F 10/32*     (2006.01)
    *H03K 19/16*     (2006.01)
    *B82Y 10/00*     (2011.01)
    *H01L 29/423*     (2006.01)
    *H01L 29/08*     (2006.01)

(52) U.S. Cl.
    CPC ........ *G11C 11/161* (2013.01); *G11C 11/1675* (2013.01); *G11C 11/18* (2013.01); *G11C 11/223* (2013.01); *H01F 10/3268* (2013.01); *H01L 29/08* (2013.01); *H01L 29/24* (2013.01); *H01L 29/423* (2013.01); *H03K 19/16* (2013.01)

(58) Field of Classification Search
    CPC ... G11C 11/161; G11C 11/1675; G11C 11/18; G11C 11/223; H01F 10/3268; H03K 19/16
    See application file for complete search history.

(56) References Cited

U.S. PATENT DOCUMENTS

| | | | |
|---|---|---|---|
| 2014/0231888 A1* | 8/2014 | Kelber | H01L 29/78 257/295 |
| 2015/0243414 A1* | 8/2015 | Binek | C01G 37/027 252/62.51 C |
| 2017/0069831 A1* | 3/2017 | Nikonov | H01L 43/08 |

* cited by examiner

| voltage right FM injects spin up current | voltage left FM injects spin down current | voltage gate 0 passes down, 1 passes up | current at output sum of passed currents |
|---|---|---|---|
| 0 | 0 | 0 | 0 |
| 1 | 0 | 0 | 0 |
| 0 | 1 | 0 | 1 |
| 1 | 1 | 0 | 1 |
| 0 | 0 | 1 | 0 |
| 1 | 0 | 1 | 1 |
| 0 | 1 | 1 | 0 |
| 1 | 1 | 1 | 1 |

Out = A*C + B*notC

MAGNETO-ELECTRIC LOGIC DEVICES USING SEMICONDUCTOR CHANNEL WITH LARGE SPIN-ORBIT COUPLING

CROSS-REFERNCE TO RELATED APPLICATION

The present invention claims the benefit of U.S. Provisional Application Ser. No. 62/460,164, filed Feb. 17, 2017, which is hereby incorporated by reference in its entirety, including any figures, tables, and drawings.

GOVERNMENT SUPPORT

This invention was made with government support under ECCS1508541 awarded by the National Science Foundation. The Government has certain rights in the invention.

BACKGROUND

Magneto-electric materials provide a way to obtain voltage control of the interface magnetism of a magneto-electric antiferromagnet gate in unique field effect transistor (FET) devices. These devices could provide reliable room-temperature operation with large on/off ratios, well beyond what can be achieved using magnetic tunnel junctions.

SUMMARY

A magneto-electric logic device using a semiconductor channel with large spin-orbit coupling (SOC) is presented. This device can include a first gate contact; a magneto-electric (ME) layer on the first gate contact, a SOC layer on the ME layer, a dielectric layer on the SOC layer, a second gate contact on the dielectric layer, a first source contact on the SOC layer, and at least one drain contact on the SOC layer. The first and second gate contacts, the first source contact, and the at least one drain contact can be metal.

The magneto-electric device can further include a second source contact on the SOC layer. When the device includes two source contacts, one source contact can be a right spin source contact and the other source contact can be a left spin source contact. In some cases of a device with two source contacts, some or all of the device contacts can be ferromagnetic (FM). Additionally, providing a thin oxide layer of less than 1 nm thickness between the two source contacts and the SOC layer can increase spin polarization in injected electrons. Examples of oxides for the thin oxide layer may include $Al_2O_3$, $SiO_2$, $Sc_2O_3$, $HfO_2$, and MgO.

The materials used in the device may be chosen to optimize performance. The ME layer can be an insulating dielectric that is antiferromagnetic (AFM) and can be, for example, $Cr_2O_3$, boron-doped $Cr_2O_3$, $BiFeO_3$, $LuFeO_3$, or $Yb_{1-x}Lu_xFeO_3$. The SOC layer can be a large impedance (Z) narrow channel conductor, for example, formed of $WS_2$, $WSe_2$, $WTe_2$, $In_4Se_3$, $In_4Te_3$, $HfS_3$, $Mo_2S_3$, $W_2S_3$, InP, or $(Bi_{1-x}Sb_x)_2Te_3$ ($0 \le x \le 1$). In some cases, the SOC layer is a topological insulator. The dielectric can be, for example, $HfO_2$, MgO, $SiO_2$, $Sc_2O_3$, $Gd_2O_3$, or $Al_2O_3$.

The device can be easily cascadeable to other devices in an integrated circuit (IC). To do this, the output of a first stage device can be coupled to the input of a next stage device.

To write the state of the device, a positive or negative voltage is applied to the top gate (and/or the bottom gate). In response to the electric field from the applied voltage across the gates, boundary spin polarization as well as anti-ferromagnetic (AFM) domain state in the ME layer are switched. To read the state of the device, a positive or negative voltage is applied to the source and drain of the device. Appreciable charge current only flows through the SOC channel in the direction of low-resistance. The current conducted in the channel can be used to charge next stage transistor gates (as roughly a capacitor) and to switch the AFM order in these elements, which allows the device elements to be easily cascadeable.

In some embodiments, the magneto-electric device can be ferroelectrically gated. In an example implementation, the structure is a ferroelectrically gated magneto-electric field effect transistor that includes a first gate contact, a ferroelectric layer on the first gate contact, an SOC layer on the ferroelectric layer, a dielectric layer on the SOC layer, a second gate contact on the dielectric layer, a source contact on the SOC layer, a left drain contact on the SOC layer, and a right drain contact on the SOC layer. The SOC layer may be a two-dimensional (2D) transitional metal dichalcogenide (TMD) or a 2D transitional metal trichalcogenide (TMTC). The dielectric under the second gate contact may be a ferroelectric material. Additionally, some or all of the drain contacts and source contact may be a ferromagnetic material.

BRIEF DESCRIPTION OF DRAWINGS

FIG. 1A shows a boundary polarization of the device when a positive voltage is applied to the top gate and the bottom gate is tied to ground; and FIG. 1B shows a boundary polarization of the device when a negative voltage is applied to the top gate and the bottom gate is tied to ground.

FIG. 3A is an image of the prototype device and FIGS. 3B and 3C, respectively, are a side view and top view representation of the prototype device.

FIGS. 6A and 6B show the direction of the surface magnetization of the AFSOR magneto-electric field effect transistor multiplexer. FIG. 6C shows that zero current flows to the drain when a certain voltage is applied to the gate electrode.

DETAILED DESCRIPTION

A magneto-electric logic device using a semiconductor channel with large spin-orbit coupling (SOC) is presented.

Certain implementations of the described magneto-electric logic devices incorporate a voltage-controlled nonvolatile spin state variable into a scalable memory device with additional logical function. The voltage control of a non-volatile spin state is desirable in the area of spintronics due to the ability to avoid or minimize the need for large current densities, the accompanying power consumption, and detrimental Joule heating on writing and potentially also on reading.

It is desirable that a magneto-electric (ME) device have a high gain to allow for cascading from one device to the next without significant effort. It is further desirable that the device comprise an anti-ferromagnetic layer, rather than a ferromagnetic layer, so the delay time of the device write operation is not constrained by the long delay time required to switch a ferromagnetic layer. Additionally, the applied magnetic field of the ME device is static and has no constraints, so the voltage can be adjusted to the best value for logic and memory.

A magneto-electric device is provided that may include one or more of these desirable features. The device can have its computational state stored as anti-ferromagnetic (AFM) order (with a concomitant specific boundary polarization), with magneto-electric switching of AFM order as voltage is applied. The device's semiconductor channel can be a two-dimensional (2D) material with large spin-orbit coupling (SOC), where AFM's surface magnetization controls transport in the channel (e.g., high resistance in one direction and low resistance in the other). In certain embodiments, the magneto-electric device may be characterized as an anti-ferromagnetic magneto-electric spin-orbit read (AFSOR) logic device.

Figure 1A:
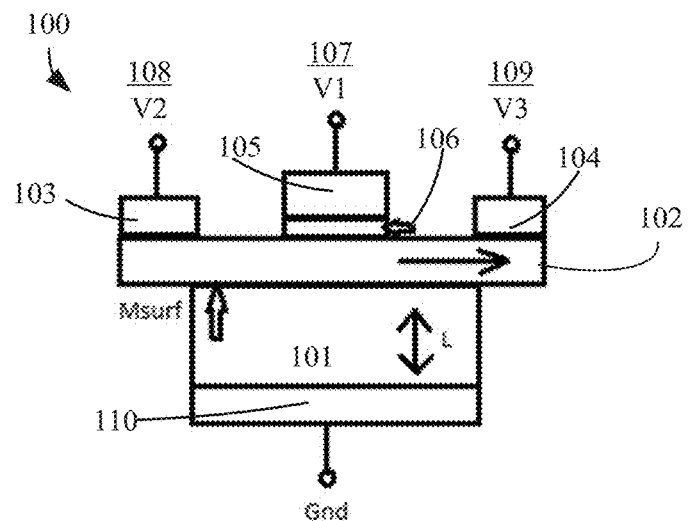
FIGS. 1A and 1B show a cross-sectional view of an embodiment of a magneto-electric logic device.
Figure 1B:
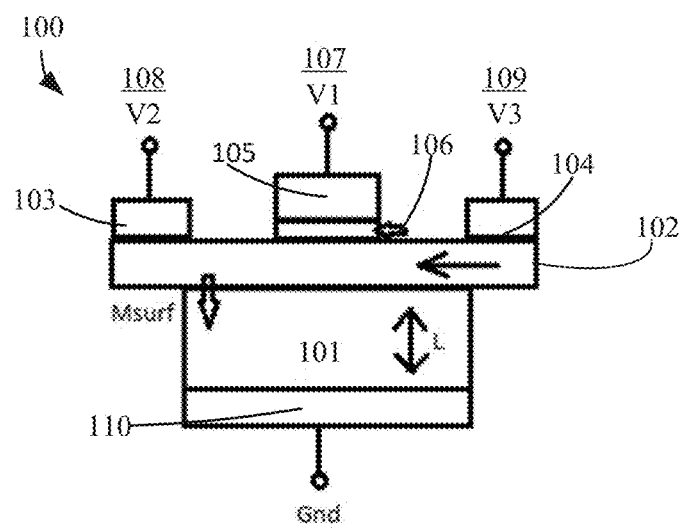

A magneto-electric logic device using a semiconductor channel with large SOC to enhance the on/off ratio is presented. The logic device can be used in any circuit that uses transistors as part of a logic gate. FIGS. 1A and 1B show a cross-sectional view of an embodiment of a magneto-electric logic device. FIG. 1A shows a boundary polarization of the device when a positive voltage is applied to the top gate and the bottom gate is tied to ground. FIG. 1B shows a boundary polarization of the device when a negative voltage is applied to the top gate and the bottom gate is tied to ground. Referring to FIGS. 1A and 1B, the magneto-electric device 100 can be of the AFSOR type and includes a magneto-electric layer 101, a spin-orbit coupling material layer 102 on the magneto-electric layer 101; and a source contact 103, a drain contact 104, and a gate contact 105 on the spin-orbit coupling layer 102. A dielectric layer 106 is disposed between the gate contact 105 and the spin-orbit coupling layer 102. The magneto-electric layer 101 can be an insulating dielectric layer. For operation, the gate contact 105 may be connected to a first voltage source V1 107, the source contact 103 may be connected to a second voltage source V2 108, the drain may be connected to a third voltage source V3 109, and the magneto-electric layer 101 may be connected to ground (or other potential) via a metal contact layer 110 (as a bottom gate electrode). The arrow within the SOC layer 102 illustrates the direction of current flow through the channel as it relates to the applied voltage. The direction of surface magnetization, $M_{surf}$, is also shown as an arrow to indicate direction as it relates to applied voltage. As shown in FIG. 1A, when a positive voltage is applied at V1 107, current flows towards the right and $M_{surf}$ is pointing up. As shown in FIG. 1B, when a negative voltage is applied at V1 107, current flows towards the left and $M_{surf}$ is pointing down.

The magneto-electric device structure is desirable because of its potential for high and sharp voltage 'turn-on'; inherent non-volatility of boundary polarization state variables; low switching currents, which lowers power consumption; large on/off ratios; and multistate logic and memory applications. The magneto-electric device design can provide reliable room-temperature operation with large on/off ratios ($>10^7$), which is well beyond what can be achieved using magnetic tunnel junctions. The basic premise is that the boundary polarization of the magneto-electric spin polarizes or partly spin polarizes a narrower (very thin) semiconductor.

In a magneto-electric device, the spin of an electron (or hole) can be achieved by utilizing the non-volatile switching of magneto-electric gates to influence the spin-orbit coupling (SOC) in the channel. An important attribute of the SOC layer is the large splitting between the spin bands. To achieve the desired large splitting between the spin bands, the SOC layer can be a large impedance (Z) narrow channel conductor. The material of the large Z narrow channel conductor can be, for example, a material such as, but not limited to: $WS_2$, $WSe_2$, $WTe_2$, $In_4Se_3$, $In_4Te_3$, $HfS_3$, $Mo_2S_3$, $W_2S_3$, InP, or $(Bi_{1-x}Sb_x)_2Te_3$ ($0 \leq x \leq 1$). In the context of narrow channel conductors, large Z can be defined in terms of materials made from heavy elements where spin-orbit coupling is large, i.e. several hundred meV or larger. In some cases, the large Z can be identified in terms of a device's on/off ratio. A narrow channel conductor, where spin-orbit coupling is large, leads to improvements in the device's on/off ratio to greater than $10^4$, and more likely greater than $10^7$. Non-volatility in such possible devices comes from the magneto-electric gate, while magneto-electric sensing effect from the voltage control of the large spin orbit coupling.

In some implementations, materials such as, but not limited to $HfS_2$, $In_4Se_3$, $In_4Te_3$ or the electron gas that forms at the surface/interface of InP and InAs are used as spin-orbit coupling channel materials (e.g., for the SOC layer 102) because of the scalability of these materials, which are likely to be scalable to spatial channel widths of 10 nm or less. These latter channel materials are viewed as somewhat advantageous as they combine significant spin orbit coupling and a minimum of edge scattering. It should be noted that in the case of various topological insulators (TIs), edge scattering will actually increase the influence of spin orbit coupling, and a thin layer TI will form a band gap. Thus, should the chemical potential fall mid gap, the device can retain the desired high on/off ratios. Without the band gap, the TI will act more like a spin valve, and may suffer from a decrease in on/off ratio and spin fidelity, in the limit of small spatial dimensions, in spite of the very large spin orbit coupling.

The roughness-insensitive boundary magnetization at the interface between the magneto-electric layer and the narrow channel semiconductor is strongly coupled to the bulk anti-ferromagnetic order parameter and concomitant interface polarization, and follows the latter during voltage-controlled switching. Referring again to FIGS. 1A and 1B, quantum mechanical exchange coupling between the boundary magnetization and the carrier spins in the narrow channel gives rise to damped precession of the spins injected from the source at V2 103. When utilizing channel materials with near-zero spin-orbit coupling, such as graphene or Si, the effective exchange field of the voltage-controlled boundary magnetization is the sole source for spin precession. If the narrow channel conductor is sufficiently thin (in the region of 1 to 2 nm or less), the transport channel will be spin polarized by the proximity effect. Modulated spin precession, and added functionality is possible if spin-orbit coupling is exploited, as would be the case illustrated in FIGS. 1A and 1B. Even when utilizing channel materials with high spin orbit coupling, such as a $WSe_2$ monolayer, the boundary polarization of the magnetoelectric layer, such as chromia, induces a high level of polarization. This means that for small source-drain bias voltages, the carriers that pass over the magnetoelectric gate are of necessity, highly spin polarized.

An operation procedure of the magneto-electric device 100 can be as follows. To write the state, a positive or negative voltage is applied at V1 107 to the device 100. In response to an electric field generated by the potential applied between the top and bottom gates (e.g., at 105 and 110), paraelectric polarization as well as AFM order (L) in the ME layer 101 are switched. Surface magnetization ($M_{surf}$), tied to the value of L, polarizes spins of carriers in the SOC material of the SOC layer 102 and induces preferred conduction, such as much lower resistance in only one direction along the SOC channel 102. In other words, the influence of $M_{surf}$ on the channel produces directionality of conduction, which is not possible through conventional gate dielectrics.

Figure 2:
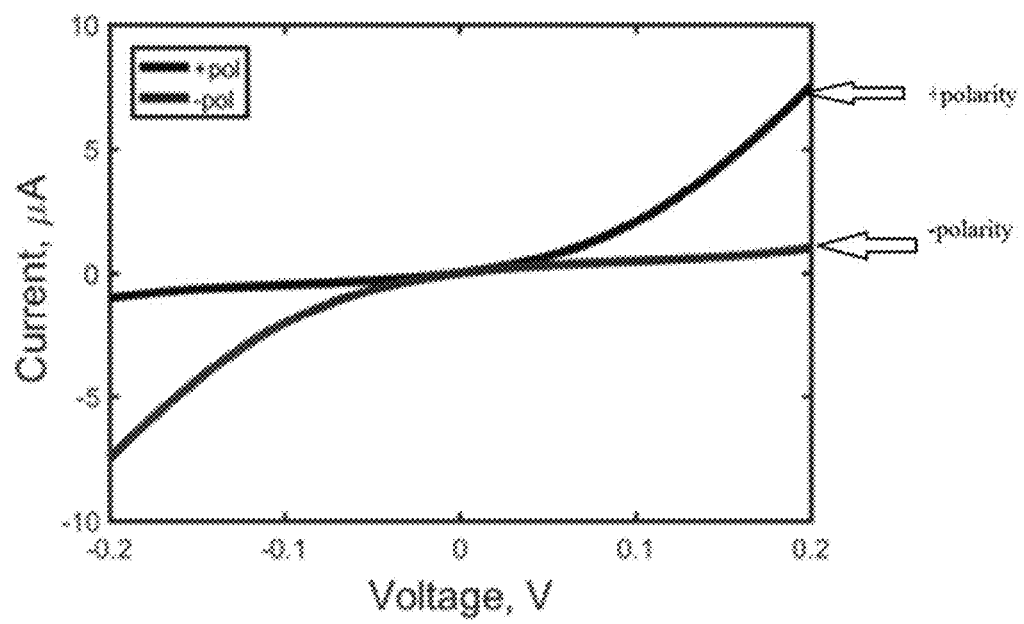
FIG. 2 shows the source to drain current versus voltage V1 of a prototype magneto-electric device implemented as shown in FIGS. 1A and 1B.

FIG. 2 shows the source to drain current versus voltage V1 of a prototype magneto-electric device implemented as shown in FIGS. 1A and 1B. With reference to FIGS. 1A and 1B, the SOC channel 102 can be polarized in opposite directions, indicated in FIG. 2 as +polarity and −polarity, by the magnetoelectric gate 105. To read the state, a positive or negative voltage (V2-V3) is applied to the source 103 and drain 104 of the device 100. Appreciable charge current only flows in low-resistance direction. The current conducted in the channel 102 is used to charge next stage capacitors and thus to switch AFM in these elements. Thus, magneto-electric device elements are easily cascadeable.

The magneto-electric device of FIGS. 1A and 1B uses spin-orbit coupling in the channel to modulate spin polarization in the device. As an alternative to metal contacts (e.g., for the source and drain electrodes), a ferromagnetic (FM) material may be used. The first gate contact 110 (bottom electrode) can also be designed to be ferromagnetic but exchange decoupled, thus serving as electrode and magnetic field source.

Some advantages of certain implementations of the magneto-electric device include one or more of: 1) AFM order and magneto-electric switching is not affected by sidewall roughness nor surface roughness, 2) write operation is much faster, around 30 ps, since there is no need to switch a ferromagnet, 3) it is possible to use a 2D material for a channel, which allows for control of boundary polarization (boundary magnetization) $M_{surf}$, and 4) influence of Msurf on the channel produces directionality of conduction, which may not available by other means, as well as the conductivity through the channel.

Even a single gated magneto-electric device can enable high on/off ratios. Since the spin current undergoes a lateral force, spin up and spin down are separated and could be "read" by "split" drains, although the use of spin polarized drain electrodes will clearly enhance the on/off ratio of the drain current and the spin Hall voltage (voltage at one drain minus the voltage at the other drain). This spin Hall voltage is materials dependent and should be modeled, but can be estimated to be in the region of 40 mV or more.

Figure 3A:
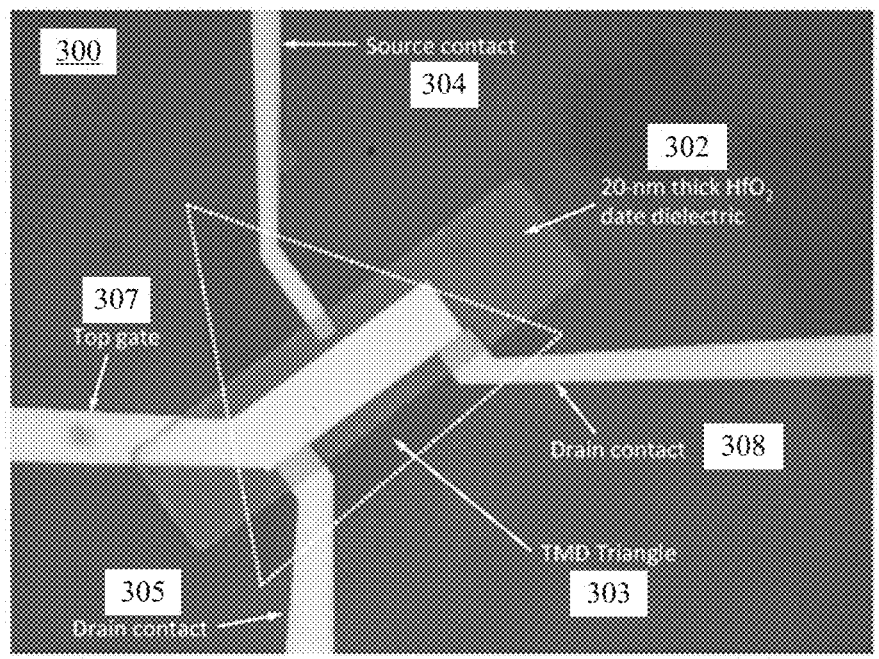
FIGS. 3A-3C illustrate a "split" drain prototype magneto-electric device.
Figure 3B:
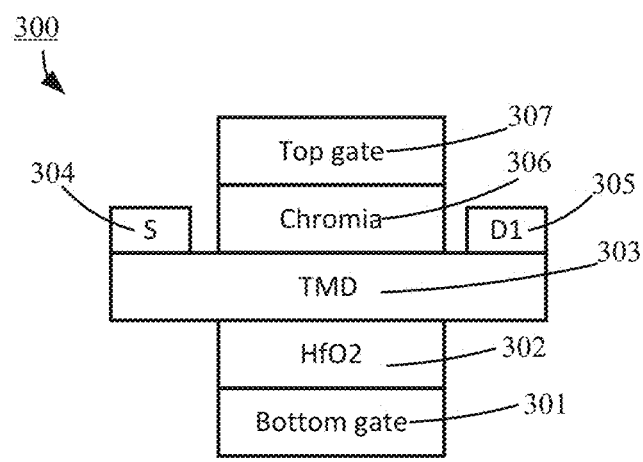
Figure 3C:
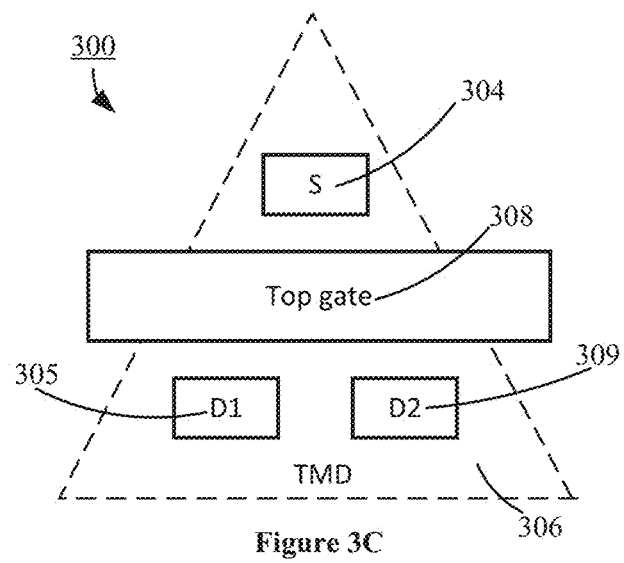

FIGS. 3A-3C illustrate a "split" drain prototype magneto-electric device. In this example, the structure is a magneto-electric field effect transistor multiplexer of the AFSOR type with a semiconductor channel with large spin-orbit coupling. FIG. 3A is an image of the magneto-electric field effect transistor multiplexer of the prototype device 300 and FIGS. 3B and 3C respectively are a side view and top view representation of the prototype device 300. Referring to the side view representation of FIG. 3B, the device 300 includes a bottom gate 301, a bottom gate dielectric 302, a narrow channel 303, a source contact 304, a first drain contact 305, a top gate dielectric 307, and a top gate 308. Additionally, as shown in the views of FIGS. 3A and 3C, a second drain contact 309 is also on the narrow channel 303. In FIGS. 3A-3C, the narrow channel 303 may be a transition metal di-chalcogenide (TMD). Referring to the prototype as represented in FIG. 3A, $WSe_2$ was used as the narrow channel 303, magneto-electric chromia was used as the material for the top gate dielectric 307 (the bottom gate of FIG. 5A), and $HfO_2$ as the material for the bottom gate dielectric 302 (the top gate of FIG. 5A).

In a material such as $WSe_2$, the spins would be defined perpendicular to the plane, so that the magnetized drain electrode should, in the simplest implementation, have magnetization perpendicular to the plane as well. This would align with the induced spin polarization from a magneto-electric like chromia as this too is perpendicular to the plane. Note that if a ferromagnetic contact is used, there would be no "switching" of any ferromagnetic contact in normal device operation, so any ferromagnet used in such a device would have static magnetization.

Both discrete-element and integrated approaches to multistate logic and memory are possible. The multistate aspect of the device could be a huge savings in power, delay time and reduce overall circuit complexity for memory applications.

Figure 4:
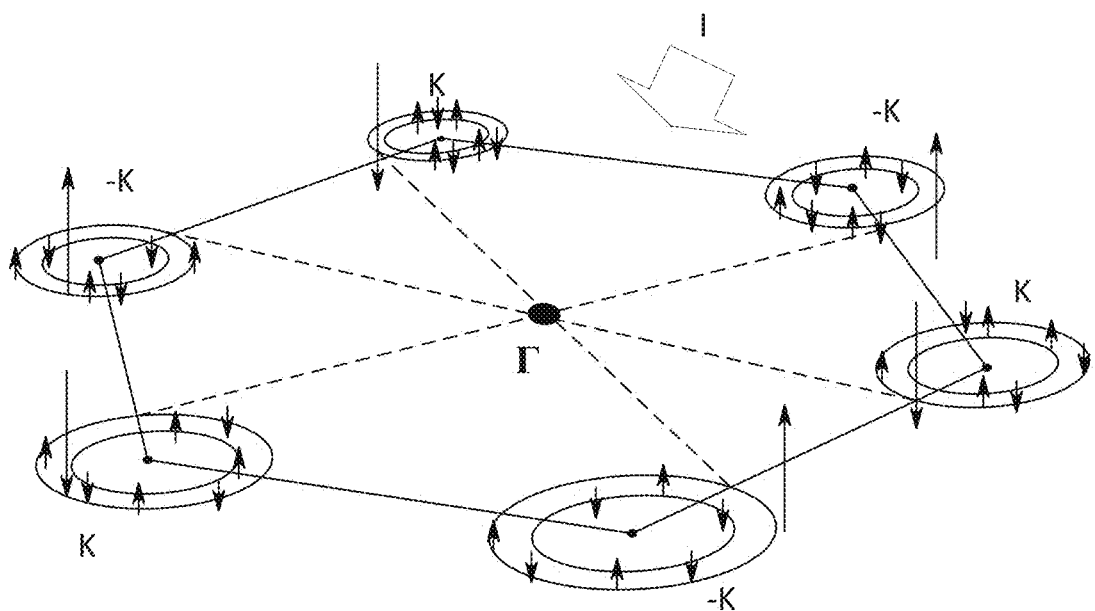
FIG. 4 illustrates left-right asymmetry of spin orbit coupling as might arise in a transition metal di-chalcogenide (TMD).

FIG. 4 illustrates left-right asymmetry of spin orbit coupling as might arise in a TMD, such as the materials listed above for the SOC layer. The output is a voltage difference when spin-orbit coupling is "turned on" between the two FM drain contacts (see e.g., FIGS. 3A and 3C) due to the spin-Hall effect. This output voltage can be modulated by the gate or gates (when top and bottom gated), which influences the spin-orbit interaction in the channel, especially when top and bottom are gated. The spin-Hall voltage in the device can be increased by using different FMs in the source and drain.

In addition to being configured as a logic element, the ME device as shown in FIGS. 3A-3C can also be used to provide multi-valued logic as the two drains can be turned on or off by different combinations of gate electrode voltages. The induced spin polarization of the channel can be altered by changing the boundary polarization of the gates, manipulated by using the magneto-electric properties of the gate dielectric layer. The spin-orbit coupling can be changed by the electric field across the channel, and the current channel can be turned off by the net bias applied to the channel. This multistate memory or logic can be especially robust if the source is spin polarized as well, although the magnetization of the source is by no means essential as for the overall device to work, as spin injection is not essential. One advantage of certain implementations of this device over conventional spin FET devices is that the output voltage from a first stage can be coupled to the input voltage of a next stage to directly to drive the next stage in a circuit, without the need for additional devices. This may help in reducing the device count in logic circuits.

Several 2D crystals have strong spin-orbit coupling, for example the TMD materials $WS_2$ and $WSe_2$, which makes these materials attractive as a channel material. $WSe_2$ is especially attractive due to its strong spin-orbit coupling energy (~513 meV) that can be measured by angle resolved photo-emission spectroscopy and the fact that this material is reliably p-type. Such high spin-orbit coupling may allow operation well above room temperature. $WS_2$ also has strong spin-orbit coupling, but is not reliably p-type. An issue is that with the TMDs (e.g., $MoS_2$, $WS_2$, $MoSe_2$, $WSe_2$, $MoTe_2$), hole transport (not electron transport) is generally required to obtain the largest spin Hall voltages in the TMDs. The spin-orbit coupling mediated spin Hall effect tends to be much less significant if electrons are the majority carrier.

The schematic cross-sections of the variations of these magneto-electric devices, as shown in FIGS. 1A and 1B (and FIG. 3B), may utilize the atomic-scale thickness of 2D crystals for spin applications. The ON/OFF ratio of spin FETs is known to be degraded by low spin injection efficiencies, as noted above, caused by the spin-conductivity mismatch between their ferromagnetic (FM) contacts and a non-magnetic (NM) semiconductor channel. This mismatch can be circumvented by inserting a thin tunnel barrier, formed by placing a thin oxide layer, between the FM contact and a 2D semiconductor (if used), allowing the higher fidelity spin current tunneling into the semiconductor to dominate.

By adopting a scheme based solely on magneto-electric switching, the device speed will be limited only by the switching dynamics of the magneto-electric (approximately 2 ps to 100 ps), thereby avoiding the long delay times plaguing other spintronic devices that rely on the slower switching of a ferromagnetic layer (as long as 5 ns). Switching of the induced spin-polarization has an advantage to be extremely fast when compared with the precessional switching of remnant magnetization (typically ns but no faster than 178 ps to 500 ps). The massive decrease in switching speed time, relative to other spintronic or ferroelectric devices is because there is no ferromagnet to "switch", and the proposed magneto-electrics are paraelectric, so the longer delay times seen with ferroelectrics would not been seen for a magneto-electric device of the AFSOR type.

Magnetization in the conduction channel with spin-orbit coupling is switched by precessional switching. The effective spin polarization, $P_{eff}$, in inverse Rashba-Edelstein effect is $$P_{eff} \sim w*\lambda/d \sim 100 \text{ nm}*0.3/3 \text{ nm} \sim 10 \quad (1)$$

where w is the width of the magnet, d is the thickness of the spin-orbit channel, and $\delta \sim 0.3$ is the spin orbit coefficient for $Bi_2Se_3$. Then the charge required for switching is approximately $$Q_{fm} = eN_s/P_{eff} \sim 1.6 \times 10^{-19} * 1 \times 10^4/10 \sim 160 \text{ aC} \quad (2)$$

for a magnet with $Ns=10^4$ spins (Bohr magnetons). Current delivered by a present-day transistor at source-drain voltage of 0.1 V can be as large as 6 µA. Then the pulse needed to conduct this charge can be <30 ps. However, the ferromagnetic state switching is slower, ~500 ps, as limited by the precession frequency of magnetization. The energy of the ferromagnetic state switching (16 aJ) is determined mostly by Joule heating, i.e.

$$U = Q_{fm} V_s \sim 16 \text{ aJ}. \quad (3)$$

The voltage-controlled switching of magneto-electric phenomena, through spin orbit coupling allows the AFSOR device to consume less power in switching. Integration of multiple inputs into a single magneto-electric device simplifies circuit structure by reducing the number of devices needed for logic. The use of materials with large spin-orbit coupling may lead to enhanced carrier mobility.

Transistors will typically have better on/off ratios than a tunnel junction device and, as such, have greater potential for use in logic devices than a spintronics device based on a tunnel junction, and thus would have possibly great applicability. The on/off ratio may be crudely estimated by taking the product of the on/off ratio of a 2D channel device (experimentally shown to extend up to $10^8$ for $MoS_2$ and $10^6$ for $WSe_2$) and the magneto-resistance effect of $10^2$ for the ferromagnetic drain and the induced spin polarization of the channel. This leads to a very high on/off ratio overall: $>10^4$, more likely $>10^7$. The situation is such that the lower the conductional channel mobility, the higher the transistor on/off ratio, because of the great effect of the induced polarization of the conduction channel by the magneto-electric gates.

In addition to being configured as a logic element, magneto-electric devices can also be used to provide multi-valued logic as the two drains (such as shown in FIGS. 3A and 3C) can be turned on or off by different combinations of gate electrode voltages. This multistate memory or logic is especially useful if the source is spin polarized as well, although the magnetization of the source is by no means essential as for the overall device to work, as spin injection is not essential. The advantage of this device over conventional spin FET devices is that the output voltage can be directly used to drive the next stage in a circuit, without the need for additional devices. This can result in reducing the device count in logic circuits.

Figure 5A:
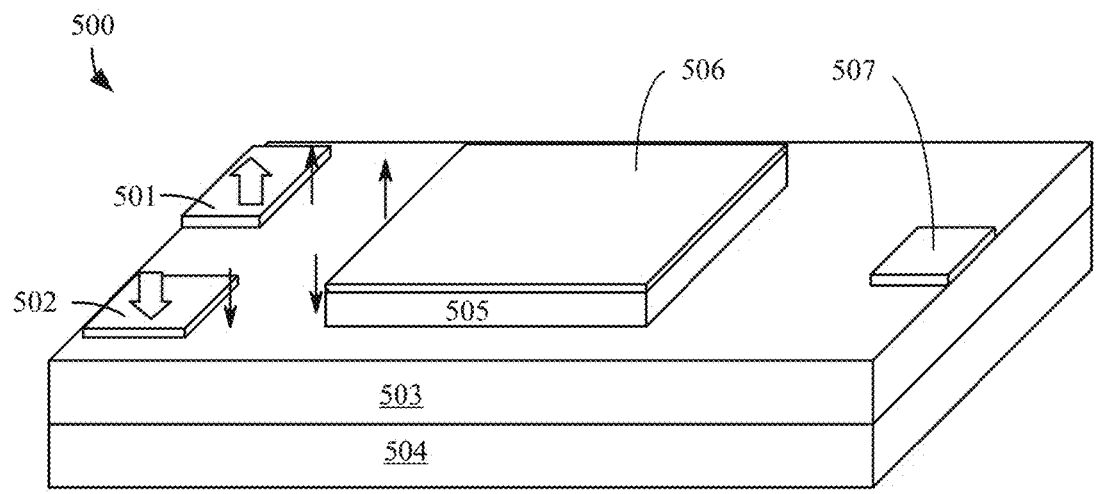
FIG. 5A shows an example illustration of an AFSOR magneto-electric field effect transistor multiplexer.

In an example implementation, the device can operate as an anti-ferromagnetic magneto-electric field effect transistor multiplexer with a semiconductor channel with large spin-orbit coupling. FIG. 5A shows an example illustration of an AFSOR magneto-electric field effect transistor (FET) multiplexer. The AFSOR FET multiplexer 500 includes two sources 501, 502; a spin orbit coupling layer 503, a magneto-electric layer 504, a gate dielectric 505, a gate electrode 506, and a drain 507. In this example, the AFSOR FET 500 operates as a 2-way multiplexer "gate". This example differs from the previous example illustrated in FIG. 1 in that the device of FIG. 5A contains two ferromagnetic sources, a right spin source 501 and a left spin source 502 to inject spin polarized current, as shown by the direction of the arrows in 501 and 502. As shown in FIG. 5A, the two sources are magnetized in opposite directions. The purpose of adding sources is to allow for more logical inputs, which allows for greater logical functionality. The magneto-electric gate dielectric surface magnetization couples to the SOC in the conduction channel 503 to ensure only ONE or the other source is active, not both. The magneto-electric gate dielectric material 504 can be an ME insulating dielectric layer such as described with respect to layer 101 of FIGS. 1A and 1B. The narrow channel conductor 503 can be any SOC material such as described above (including with respect to SOC layer 102 of FIGS. 1A and 1B). Because the surface magnetization couples to the SOC in the conduction channel, the large on/off ratio ($>>10^7$) is not significantly diminished. This logic device as a multiplexer "gate" may lead to a versatile logic scheme utilizing switchable spin-orbit states.

Figure 5B:
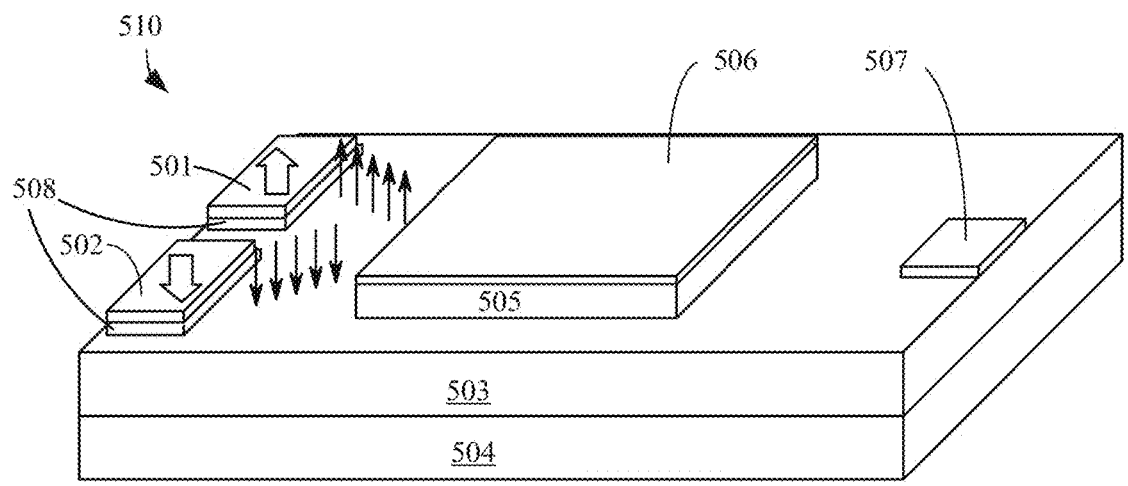
FIG. 5B shows an example implementation of an AFSOR magneto-electric field effect transistor multiplexer with an oxide layer between the two source contacts and the channel.

Difficulty can arise when injecting electrons with polarized spins from a ferromagnetic source, 501 or 502, into the narrow channel conductor 503. This is due to the ferromagnetic source, 501 or 502, having a different resistance for spins along its magnetization and spins opposite to its magnetization. The narrow channel conductor, on the other hand, has a larger dominant resistance that is independent of spin. Inserting a thin oxide layer between the ferromagnetic sources 501 and 502 and the narrow channel conductor 503 can increase spin polarization in injected electrons. The oxide presents resistance comparable to that of the narrow channel conductor and its resistance also depends on the direction of spin. The oxide material can be, for example, MgO, $Al_2O_3$, $Sc_2O_3$, $HfO_2$ or $SiO_2$. The thickness of the thin oxide layer can be less than 1 nm. FIG. 5B shows an example implementation of an AFSOR magneto-electric field effect transistor multiplexer with an oxide layer between the two source contacts and the channel. Referring to FIG. 5B, the AFSOR device 510 includes the same structure as device 500, but further includes an oxide layer 508 between the sources 501, 502 and the SOC layer 503.

Figure 6A:
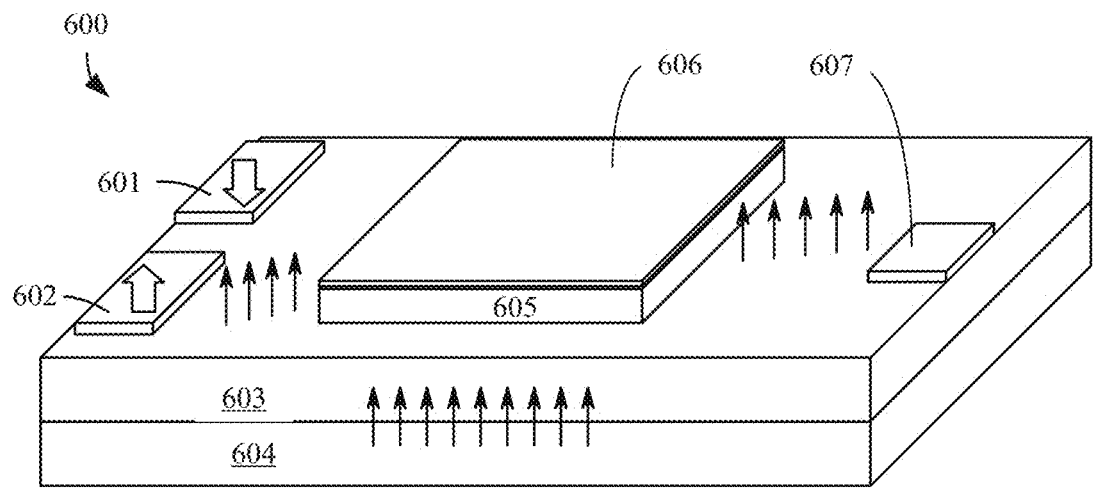
FIGS. 6A-6C illustrate spin current and boundary polarization of an AFSOR magneto-electric field effect transistor multiplexer.
Figure 6B:
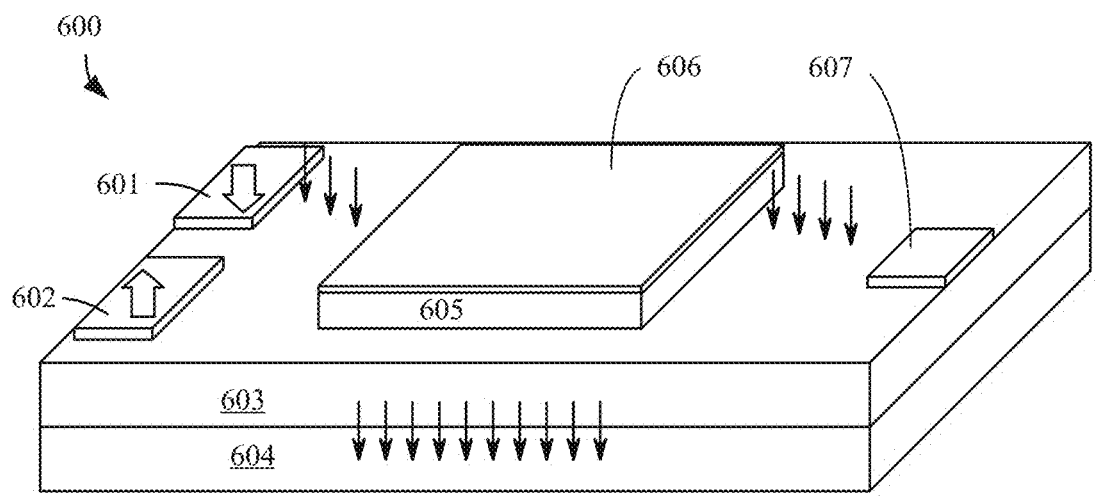
Figure 6C:
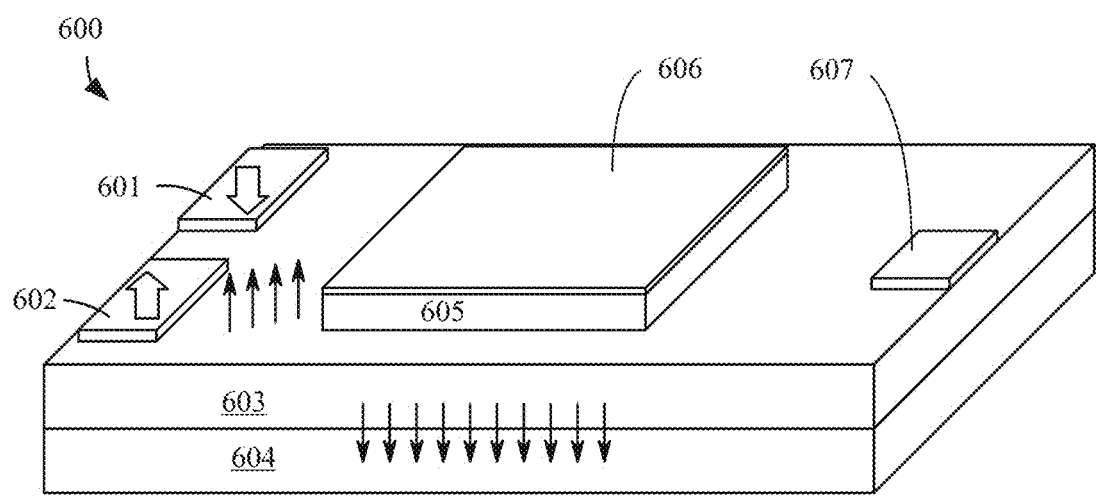

FIGS. 6A-6C illustrate spin current and boundary polarization of an AFSOR magneto-electric field effect transistor multiplexer. Similar to that described with respect to device 500, device 600 includes two sources 601, 602; a spin orbit coupling layer 603, a magneto-electric layer 604, a gate dielectric 605, a gate electrode 606, and a drain 607. FIGS. 6A and 6B show the direction of the surface magnetization of the AFSOR magneto-electric field effect transistor multiplexer. In FIG. 6A, the right spin source 601 is active. When the right spin source is active, the boundary polarization or boundary magnetization $M_{surf}$ should be in a spin down configuration. In FIG. 6B, the left spin source 602 is active. When the left spin source is active, $M_{surf}$ should be in a spin up configuration. As a logic device, the multiplexer 600 has two inputs. The two inputs are the direction of magnetization in the channel as a result of the boundary polarization, and the voltage at the gate. Up and down directions of magnetization are shown in FIGS. 6A and 6B and are designated as '0' and '1'. These states are non-volatile, i.e. the state condition remains even after power is turned off. FIG. 6C shows that zero current flows to the drain 607 when a certain voltage is applied to the gate electrode 606. At this certain voltage, the device channel 603 will be depleted of carriers, causing zero current to flow to the drain 607 regardless of other voltages or magnetizations of the device 600 (as shown in FIG. 6C by the absence of arrows next to the drain 607).

Figures 7A, 7B:
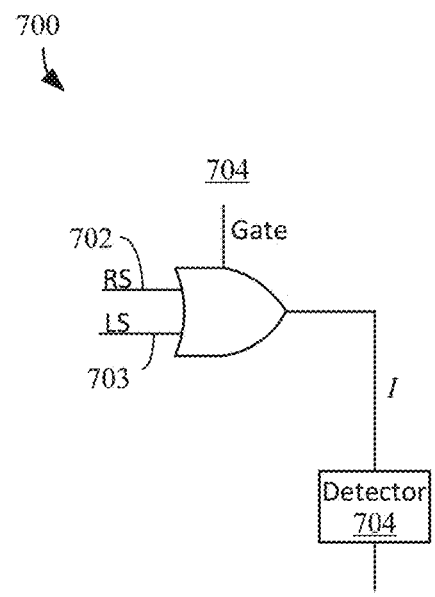
FIG. 7A shows a truth table for the operation of the AFSOR magneto-electric field effect transistor multiplexer.
FIG. 7B shows a logic gate representation of the AFSOR magneto-electric field effect transistor multiplexer.

FIG. 7A shows a truth table for the operation of the AFSOR magneto-electric field effect transistor multiplexer. The output of the device 600 can be logically summarized as Output=$A*C+B\overline{C}$, where A is the voltage applied to the right spin source that injects spin-up current, B is the voltage applied to the left spin source that injects spin-down current, and C is the voltage applied to the gate. As shown in the truth table of FIG. 7A, the input voltages correspond to a logical "0" or a logical "1" and the output is a current indicative of a logical "0" or a logical "1". FIG. 7B shows a logic gate representation of the AFSOR magneto-electric field effect transistor multiplexer 700. The logic gate representation shows an OR gate 701 with three inputs corresponding to the voltages applied to the right spin source contact 702, left spin source contact 703, and gate contact 704. A current detector 705 is positioned at the output of the device 700 to measure the output current.

In detail, operation of device 700 (when implemented as described with respect to FIG. 5A or 5B) can include receiving a voltage corresponding to a logical "0" or logical "1" to the right spin source contact; receiving a voltage corresponding to a logical "0" or a logical "1" to the left spin source contact; receiving a voltage corresponding to a logical "0" or a logical "1" to the second gate contact; and outputting a current indicative of a logical "0" or a logical "1". As shown in the truth table, in response to receiving the voltage corresponding to the logical "0" to the right spin source, and the voltage corresponding to the logical "0" to the left spin source, and the voltage corresponding to the logical "0" to the second gate contact, the current indicative of the logical "0" is output; in response to receiving the voltage corresponding to the logical "1" to the right spin source, and the voltage corresponding to the logical "0" to the left spin source, and the voltage corresponding to the logical "0" to the second gate contact, the current indicative of a logic "0" is output; in response to receiving the voltage corresponding to the logical "0" to the right spin source, and the voltage corresponding to the logical "0" to the left spin source, and the voltage corresponding to the logical "0" to the second gate contact, the current indicative of the logical "1" is output; in response to receiving the voltage corresponding to the logical "1" to the right spin source, and the voltage corresponding to the logical "1" to the left spin source, and the voltage corresponding to the logical "0" to the second gate contact, the current indicative of the logical "1" is output; in response to receiving the voltage corresponding to the logical "0" to the right spin source, and the voltage corresponding to the logical "0" to the left spin source, and the voltage corresponding to the logical "1" to the second gate contact, the current indicative of the logical "0" is output; in response to receiving the voltage corresponding to the logical "1" to the right spin source, and the voltage corresponding to the logical "0" to the left spin source, and the voltage corresponding to the logical "1" to the second gate contact, the current indicative of the logical "1" is output; in response to receiving the voltage corresponding to the logical "0" to the right spin source, and the voltage corresponding to the logical "1" to the left spin source, and the voltage corresponding to the logical "1" to the second gate contact, the current indicative of the logical "0" is output; and in response to receiving the voltage corresponding to the logical "1" to the right spin source, and the voltage corresponding to the logical "1" to the left spin source, and the voltage corresponding to the logical "1" to the second gate contact, the current indicative of the logical "1" is output. In some cases, the output current can be converted to a voltage corresponding to a logical "0" or logical "1" before inputting to another ME-based logic device.

Figure 8:
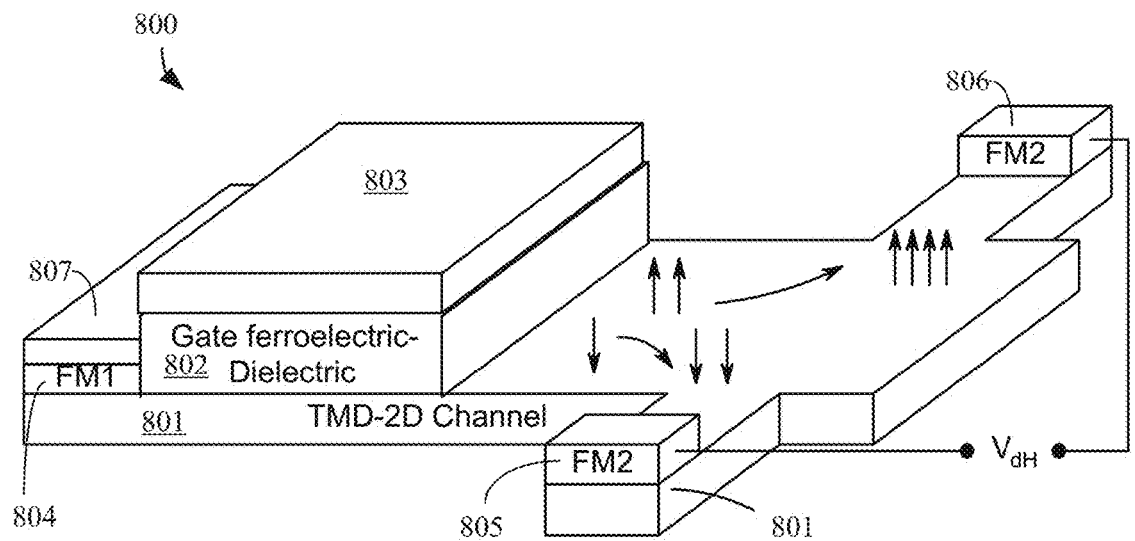
FIG. 8 shows a ferroelectric gated magneto-electric device.

In another example implementation of a magneto-electric device, the gate material can be ferroelectric. Possible ferroelectric materials include, but are not limited to, $LiNbO_3$, $BaTiO_3$, $Pb[Zr_xTi_{1-x}]O_3$ (0≤x≤1). FIG. 8 shows a ferroelectric gated magneto-electric device. In this example, the structure is a ferroelectric gated magneto-electric field effect transistor using a semiconductor channel with large spin-orbit coupling. In this implementation, the device 800 includes a spin-orbit coupling layer 801, a gate ferroelectric dielectric 802 on the SOC layer 801, a ferroelectric gate contact 803 on the dielectric 802, a source contact 804 on the SOC layer 801, a right drain contact 805 on the SOC layer 801, and a left drain contact 806 on the SOC layer 801. The source 804 can be ferromagnetic. In addition, a ferroelectric contact 807 can be on the source 804. The right drain 805 and left drain 806 can also be ferromagnetic, but may be a different ferromagnetic material than the source 804.

The SOC utilizes the atomic-scale thickness of 2D crystals. The SOC layer can be a TMD-2D channel. TMD-2D is a set of materials that exhibit strong spin-orbit coupling and therefore strong splitting between energy bands with different spin orientations. TMD-2D materials may include, for example, $WS_2$ and other materials that exhibit splitting in the energy bands. Additionally, materials such as transition metal trichalcogenides (TMTCs) may be used for the SOC layer. Similar to the device of FIGS. 1A, 1B, and 6A-6C, the device of FIG. 8 uses spin-orbit coupling in the channel to modulate spin polarization in the device. The output is a voltage difference between the two drain contacts 805 and 806 and is due to the spin-Hall effect. This output voltage can be modulated by the gate or gates, when top and bottom gated (bottom gate not shown in FIG. 8), which manipulates the spin-orbit interaction in the channel. The spin-Hall voltage, applied across the right drain 805 and left drain 806, can be increased using different ferromagnets in the source 804 and drains 805 and 806. In addition to being configured as a logic element, device 800 can also be used to provide multi-valued logic as the two drains 805 and 806 can be turned on or off by different combinations of gate electrode voltages.

Figure 9:
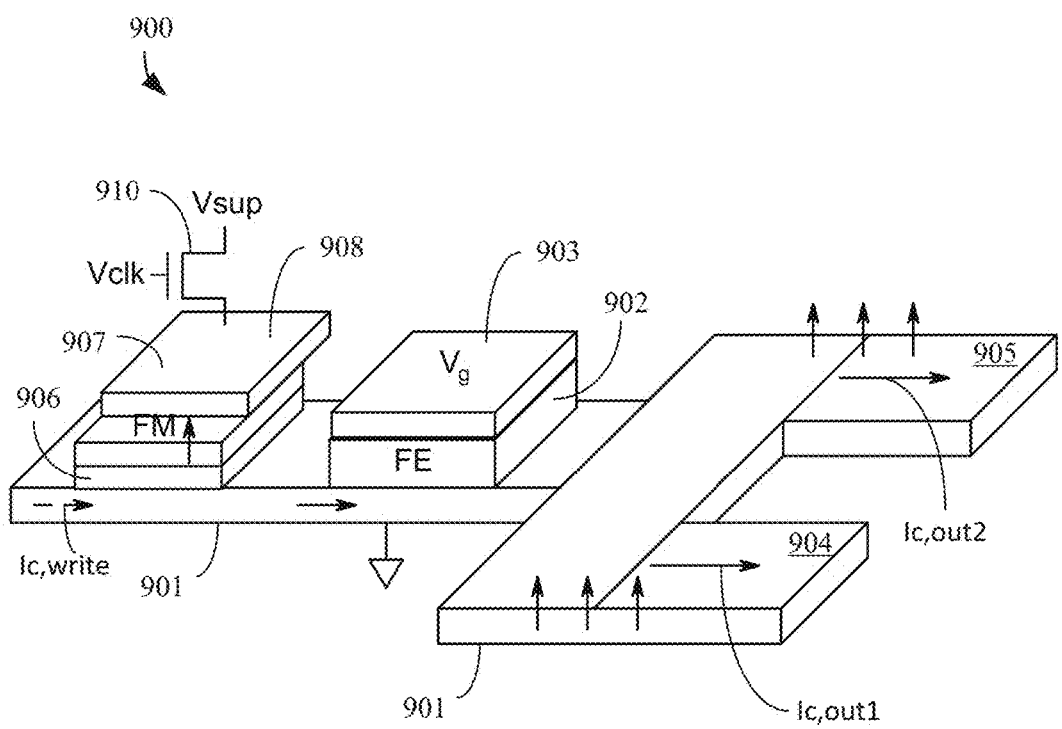
FIG. 9 shows an example implementation of a XOR gate using a ferroelectric gated magneto-electric field effect transistor.

FIG. 9 shows an example implementation of a XOR gate using a ferroelectric gated magneto-electric field effect transistor. The XOR gate 900 includes a spin-orbit coupling layer 901, a gate ferroelectric dielectric 902 on the SOC layer 901, a gate contact 903 on the dielectric 902, a right drain/output region 904 and a left drain/output region 905 that are formed from the SOC layer 901. The SOC layer 901 can be a semiconductor channel that retains large spin-orbit coupling. The channel 901 is a 2D material, such as $Bi_2Se_3$. The gate contact 903 can be a non-magnetic conductor. For the source region, a tunneling barrier 906, used for spin injection, is on the channel 901. A ferromagnetic layer 907 is on the tunneling barrier 906, and a non-magnetic conductor 908 is on the ferromagnetic layer 907. The tunneling barrier may comprise, for example, MgO. The non-magnetic conductor 904 may comprise, for example, copper. As with the device 800 in FIG. 8, in the XOR device 900, the spin-orbit coupling under the gate dielectric 902 has the coupling of spin and wave vector in a specific direction, determined by the spin-orbit coupling, whose details (in this case, the polarity of the carrier type) are determined by the gate voltage.

Referring to FIG. 9, a pulse of current can be driven through a driving transistor 910 and the ferromagnetic layer 907, resulting in a similar pulse of current (Is) in the channel, which is strongly spin polarized in the direction of magnetization. Depending on the spin polarity, the current (the charge carriers) is directed to either the right drain contact (Ic, out1) or the left drain contact (Ic, out2), due to the spin orbit coupling. While the current is conducted in the channel 901, its spin polarization will decay. The value of the charge current can be used to drive the next stage device in an IC. The outputs of the device 900 are the two charge currents, k,out1 (at 904) and Ic,out2 (at 905). The two charge currents are complementary, meaning when one current is large, the other is small. Therefore, the outputs of the device are the XOR and NXOR functions of the inputs. In typical CMOS, multiple transistors (typically at least 8) are usually needed to implement a XOR logic function. However, using the device design of FIG. 9, the XOR logic function can be implemented with a single device. As discussed for other implementations, the device 900 is easily cascadeable in an IC. The output current pulses from one device can be used to switch subsequent devices. The current pulses can be used to change the voltage at the gate and thereby to charge the ferroelectric or a dielectric capacitor.

The magneto-electric devices may provide several advantages over traditional logic devices, including faster write operations since there is no ferromagnet to switch, use of a 2D material for a channel reducing source drain leakage currents and to give better control of conductivity by surface magnetization ($M_{surf}$), influence of $M_{surf}$ on the channel produces directionality of conduction, and the AFM order and switching is not affected by sidewall roughness.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

We claim:

1. A magneto-electric device comprising:
a first gate contact;
a magneto-electric (ME) layer on the first gate contact;
a spin-orbit coupling (SOC) layer on the ME layer;
a dielectric layer on the SOC layer;
a second gate contact on the dielectric layer;
a first source contact on the SOC layer; and
at least one drain contact on the SOC layer.

2. The device of claim 1, wherein the first gate contact, second gate contact, first source contact, and at least one drain contact are metal contacts.

3. The device of claim 1, further comprising a second source contact on the SOC layer, wherein the first source contact is a right spin source contact and the second source contact is a left spin source contact.

4. The device of claim 3, further comprising an oxide layer between the first source contact and the SOC layer and between the second source contact and the SOC layer.

5. The device of claim 3, wherein the second gate contact comprises a ferromagnetic material.

6. The device of claim 3, wherein the at least one drain contact comprises a ferromagnetic material.

7. The device of claim 3, wherein the first source contact and second source contact each comprise a ferromagnetic material.

8. The device of claim 1, wherein the magnetoelectric layer comprises $Cr_2O_3$, boron-doped $Cr_2O_3$, $BiFeO_3$, $LuFeO_3$, or $Yb_{1-x}Lu_xFeO_3$.

9. The device of claim 1, wherein the SOC layer comprises $WS_2$, $WSe_2$, $WTe_2$, $In_4Se_3$, $In_4Te_3$, $HfS_3$, $Mo_2S_3$, $W_2S_3$, InP, or $(Bi_{1-x}Sb_x)_2Te_3$ ($0 \leq x \leq 1$).

10. The device of claim 1, wherein the SOC layer comprises a topological insulator.

11. The device of claim 1, wherein the dielectric layer comprises $HfO_2$, MgO, $SiO_2$, $Sc_2O_3$, $Gd_2O_3$, $HfO_2$ or $Al_2O_3$.

12. An integrated circuit comprising a plurality of the device of claim 1, wherein an output voltage from a first stage device is coupled to an input voltage of a next stage device.

13. A method of operating the device of claim 1, the method comprising: writing a state to the device, wherein writing a state comprises applying a positive or negative voltage between the first gate and the second gate to direct the boundary polarization and AFM order in the ME layer, thereby polarizing spin carriers in the SOC layer.

14. A method of operating a magneto-electric device, the device comprising a first gate contact, a magneto-electric (ME) layer on the first gate contact, a spin-orbit coupling (SOC) layer on the ME layer, a dielectric layer on the SOC layer, a second gate contact on the dielectric layer, a right spin source contact on the SOC layer, a left spin source contact on the SOC layer, and at least one drain contact on the SOC layer, the method comprising:

receiving a voltage corresponding to a logical "0" or logical "1" to the right spin source contact;
  receiving a voltage corresponding to a logical "0" or a logical "1" to the left spin source contact;
  receiving a voltage corresponding to a logical "0" or a logical "1" to the second gate contact; and
  outputting a current indicative of a logical "0" or a logical "1".

15. The method of claim 14, wherein:

in response to receiving the voltage corresponding to the logical "0" to the right spin source, and the voltage corresponding to the logical "0" to the left spin source, and the voltage corresponding to the logical "0" to the second gate contact, the current indicative of the logical "0" is output;
  in response to receiving the voltage corresponding to the logical "1" to the right spin source, and the voltage corresponding to the logical "0" to the left spin source, and the voltage corresponding to the logical "0" to the second gate contact, the current indicative of a logic "0" is output;
  in response to receiving the voltage corresponding to the logical "0" to the right spin source, and the voltage corresponding to the logical "0" to the left spin source, and the voltage corresponding to the logical "0" to the second gate contact, the current indicative of the logical "1" is output;
  in response to receiving the voltage corresponding to the logical "1" to the right spin source, and the voltage corresponding to the logical "1" to the left spin source, and the voltage corresponding to the logical "0" to the second gate contact, the current indicative of the logical "1" is output;
  in response to receiving the voltage corresponding to the logical "0" to the right spin source, and the voltage corresponding to the logical "0" to the left spin source, and the voltage corresponding to the logical "1" to the second gate contact, the current indicative of the logical "0" is output;
  in response to receiving the voltage corresponding to the logical "1" to the right spin source, and the voltage corresponding to the logical "0" to the left spin source, and the voltage corresponding to the logical "1" to the second gate contact, the current indicative of the logical "1" is output;
  in response to receiving the voltage corresponding to the logical "0" to the right spin source, and the voltage corresponding to the logical "1" to the left spin source, and the voltage corresponding to the logical "1" to the second gate contact, the current indicative of the logical "0" is output; and
  in response to receiving the voltage corresponding to the logical "1" to the right spin source, and the voltage corresponding to the logical "1" to the left spin source, and the voltage corresponding to the logical "1" to the second gate contact, the current indicative of the logical "1" is output.

16. A ferroelectric-gated magneto-electric device, comprising:

a first gate contact;
  a ferroelectric (FE) layer on the first gate contact;
  a spin-orbit coupling (SOC) layer on the FE layer;
  a dielectric layer on the SOC layer;
  a second gate contact on the dielectric layer;
  a source contact on the SOC layer;
  a left drain contact on the SOC layer; and
  a right drain contact on the SOC layer.

17. The device of claim 16, wherein the second gate contact comprises a ferroelectric material.

18. The device of claim 16, wherein the left drain contact and right drain contact comprise a ferromagnetic material.

19. The device of claim 16, wherein the source contact comprises a ferromagnetic material.

20. The device of claim 16, wherein the SOC layer comprises a 2D transitional metal dichalcogenide (TMD) or 2D transitional metal trichalcogenide (TMTC).

* * * * *